US006911129B1

(12) United States Patent
Li

(10) Patent No.: US 6,911,129 B1
(45) Date of Patent: Jun. 28, 2005

(54) COMBINATORIAL SYNTHESIS OF MATERIAL CHIPS

(75) Inventor: Yi-Qun Li, Orinda, CA (US)

(73) Assignee: Intematix Corporation, Moraga, CA (US)

(*) Notice: Subject to any disclaimer, the term of this patent is extended or adjusted under 35 U.S.C. 154(b) by 0 days.

(21) Appl. No.: 09/566,866

(22) Filed: May 8, 2000

(51) Int. Cl.[7] .......................... C23C 14/34; C23C 16/00
(52) U.S. Cl. ............................ 204/298.11; 204/298.04; 118/720; 118/721; 118/504; 427/282
(58) Field of Search ...................... 204/298.04, 298.11; 118/720, 721, 504; 427/282

(56) References Cited

U.S. PATENT DOCUMENTS

| 3,193,408 A | | 7/1965 | Triller et al. |
| 4,591,417 A | | 5/1986 | Kaiser et al. |
| 5,097,800 A | | 3/1992 | Shaw et al. |
| 6,045,671 A | * | 4/2000 | Wu et al. ................. 204/298.1 |

FOREIGN PATENT DOCUMENTS

| WO | WO 96/11878 | 5/1996 |
| WO | WO 00/43119 | 7/2000 |
| WO | WO 00/48725 | 8/2000 |
| WO | WO 00/58003 | 10/2000 |

* cited by examiner

Primary Examiner—Rodney G. McDonald
(74) Attorney, Agent, or Firm—Quine I. P. Law Group, P.C.

(57) ABSTRACT

Systems and methods for providing in situ, controllably variable concentrations of one, two or more chemical components on a substrate to produce an integrated materials chip. The component concentrations can vary linearly, quadratically or according to any other reasonable power law with one or two location coordinates. In one embodiment, a source and a mask with fixed or varying aperture widths and fixed or varying aperture spacings are used to produce the desired concentration envelope. In another embodiment, a mask with one or more movable apertures or openings provides a chemical component flux that varies with location on the substrate, in one or two dimensions. In another embodiment, flow of the chemical components through nuzzle slits provides the desired concentrations. An ion beam source, a sputtering source, a laser ablation source, a molecular beam source, a chemical vapor deposition source and/or an evaporative source can provide the chemical component(s) to be deposited on the substrate. Carbides, nitrides, oxides halides and other elements and compounds can be added to and reacted with the deposits on the substrate.

9 Claims, 10 Drawing Sheets

COMBINATORIAL SYNTHESIS OF MATERIAL CHIPS

FIELD OF THE INVENTION

This invention relates to methods and systems for deposition of chemicals in controllably variable amounts on a substrate.

BACKGROUND OF THE INVENTION

In the past decade, several workers have applied a combinatorial synthesis approach to development of new materials, or to construction of known materials in new ways. Material chip samples, with varying chemical compositions involving two or three components and with discrete or continuous composition change, can, in principle, be synthesized, using multilayers and masks. However, a true multi-composition compound probably cannot be formed unless each multilayer is formed and uniformly diffused at relatively low temperatures. This appears to require an in situ approach, which is not well understood and is not developed in the background art.

What is needed is an in situ approach and/or a multilayer approach for formation of chemical compounds having two, three or more components and having controllably variable composition on a substrate. Preferably, the approach should be flexible and should easily allow change of one or more geometric, physical and chemical parameters describing the formation process and the variation of composition with location on the substrate. Preferably, the approach should allow a choice of the geometric variation (linear, nonlinear, etc.) of one or more composition parameters according to the intended use and environment of the material chip.

SUMMARY OF THE INVENTION

These needs are met by the invention, which provides several systems and associated methods for controllably variable in situ or multilayer deposition of two or more chemical components on a substrate. In one embodiment, an ultra-high vacuum (UHV) ion beam sputtering system or evaporation system includes a multi-target carousel, a precision mask that is movable in one or two coordinate directions, x and y, and a stepper motor to move the mask by controllable amounts in the x- and/or y-directions in a timed sequence. Pure metal sputtering or evaporation targets are used to deposit precursors in selected layers. Use of a UHV environment ensures that the precursor layers are not oxidized during or after deposition. A heating element, built into or associated with a sample holder, provides thermally-driven precursor diffusion after the deposition, without exposing the sample to air during sample transfer. Ion beam sputtering has several advantages: target exchange is relatively simple; most metal targets are available; and precursor interdiffusion occurs at much lower temperatures and over shorter time intervals than are required for distribution of metal-inorganic compounds. As a further benefit, where a second ion gun is added to the assembly, oxides, nitrides, carbides, halogens and similar substances can be formed in situ from the metal precursor films.

A second embodiment involves a chemical vapor deposition (CVD) approach and provides large area uniformity for the deposition, the possibility of co-deposition of multi-component thin films with individually controllable growth rates, and control of growth of the profile.

Another embodiment uses a deposition system equipped with two or more profile-controllable, precursor sources for in situ generation of continuous phase diagrams. This embodiment uses co-deposition with a nuzzle design to generate a linear or other geometric deposition profile for each component deposited on the substrate.

In another embodiment, a mask with variable center-to-center aperture spacings and variable aperture sizes is used to deposit each of two or more chemical components onto a substrate, with the concentration of each chemical being variable independently with a location coordinate x. The concentration may vary linearly with x (preferable), as a power or combination of powers of x, or in some other nonlinear manner with the coordinate x, and two or more component concentrations may have qualitatively or quantitatively different geometric variations with x. The concentration may also vary independently in each of two location coordinate directions, for example, with the Cartesian coordinates x and y or the polar coordinates r and $\theta$.

DESCRIPTION OF BEST MODES OF THE INVENTION

Figure 1:
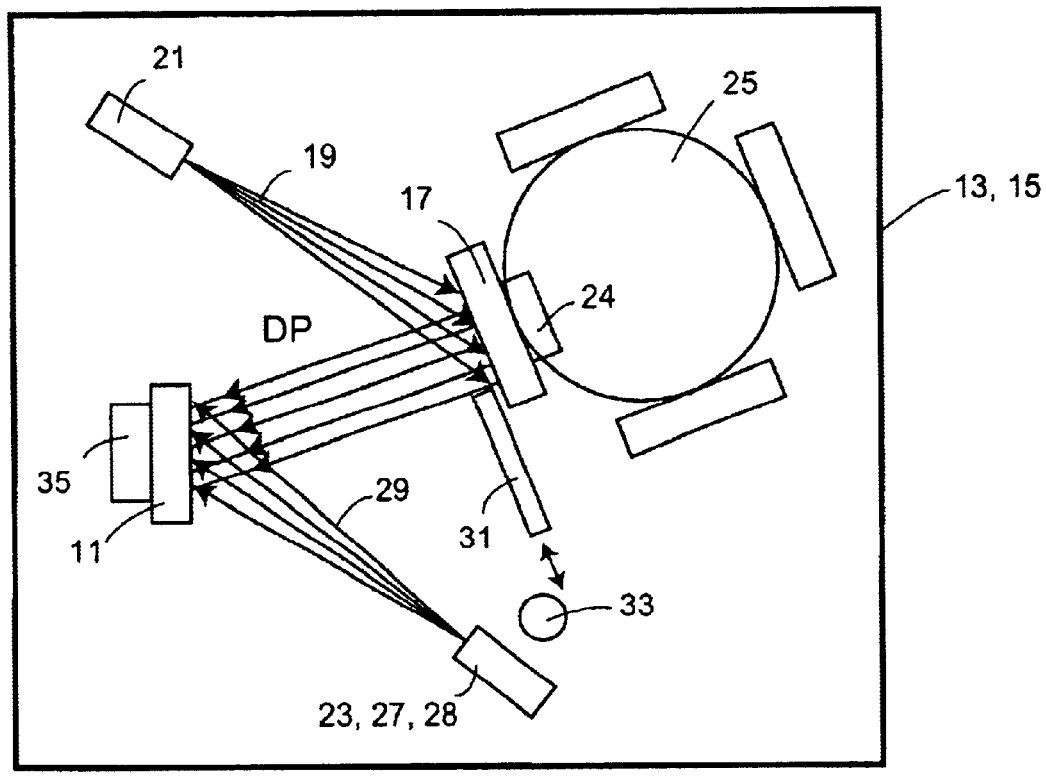
FIG. 1 is a schematic view illustrating ion beam sputtering deposition for combinatorial synthesis of a material.

FIG. 1 schematically illustrates an embodiment of the invention that uses ion beam sputtering as part of a combinatorial synthesis of a desired material. A substrate 11 is positioned inside an ultra-high vacuum chamber 13, preferably having a pressure level of $10^{-9}$ Torr or lower, using a cryogenic pump, ion pump or other pump means (not shown) suitable for metal alloy deposition. Preferably, a load-and-lock chamber 15 is provided to facilitate sample exchange without breaking the vacuum of the main chamber 13. A sputtering target 17 receives an ion beam 19, provided by an ion source 21, and produces deposition or precursor particles DP having a desired chemical composition. A portion of the precursor particles DP is received at, and deposited on, an exposed surface of the substrate 11. Growth rate of the deposited layer on the substrate 11 can be controlled, within a high precision range, by the power applied to the ion beam sputtering source 21 and by the angular orientation of the target 17 to the ion source and to the substrate 11. Real time control can be implemented using real time monitoring of, and a negative feedback loop to control, ion beam current.

Some advantages of an ion beam sputter approach are: (1) inter-diffusion between metals occurs at lower temperatures and at higher diffusion rates, in comparison with inter-diffusion of metal-inorganic compounds, where temperatures above 1000° C. are often required; (2) most metal targets are already available as precursor sources; and (3) more than one ion beam, each with a different precursor source material, can be provided in order to form compounds including lithium, sodium, potassium, rubidium, cesium, berkelium, magnesium, calcium, strontium, barium, boron, aluminum, carbon, silicon, nitrogen, phosphorous, arsenic, oxygen, sulfur, selenium, tellurium, fluorine, chlorine, bromine, iodines and similar compounds following inter-diffusion of the deposited constituents.

A carousel 25 holds and presents any one of a number N of metal or similar targets 17 for an ion beam, to produce a stream 19 of precursor particles DP that are received by the substrate 11, where N can be 1–50, or any other reasonable number. A second reactive chemical source 27 is optionally located near the substrate 11 and is oriented to provide a beam 29 of chemical particles to act as a reactive agent for in situ formation of a compound containing at least one different chemical element. After precursor deposition and interdiffusion processes are carried out, the precursors are reacted with each other and/or with any other compounds containing elements from the lithium, berkelium, boron, carbon, nitrogen, oxygen and/or fluoride columns of the Periodic Table, or other similar compounds, to form the desired final products.

The reactive chemical source 27 can be replaced or supplemented by a source 28 of a low reactivity beam, such as Ne or Ar particles, to etch the substrate or to enhance the energy locally on the substrate, useful in creating high quality thin films. Metal films have been prepared using a first ion gun for target sputtering and a second ion gun for assisting controlled growth of a thin film on a substrate. A movable mask 31 or sequence of movable masks, controlled by a mask movement device 33, covers different portions of the substrate surface at different times to perform layer-by-layer precursor deposition. A heating element 35 (optional) loacted adjacent to the substrate 11, helps to perform and control precursor interdiffusion after the initial deposition.

As an alternative, to use of an ion beam to deposit precursor particles DP on a substrate, the ion beam 21 may be replaced by an irradiation unit 23 or by a high temperature (T=600–1500° C.) heating unit 24 that acts upon the target 17 to cause evaporation of precursor particles from the target surface. A selected fraction of the evaporated particles DP are then caused to travel toward and to deposit on the substrate 11 by a particle direction control mechanism (not shown explicitly in FIG. 1).

Figure 2:
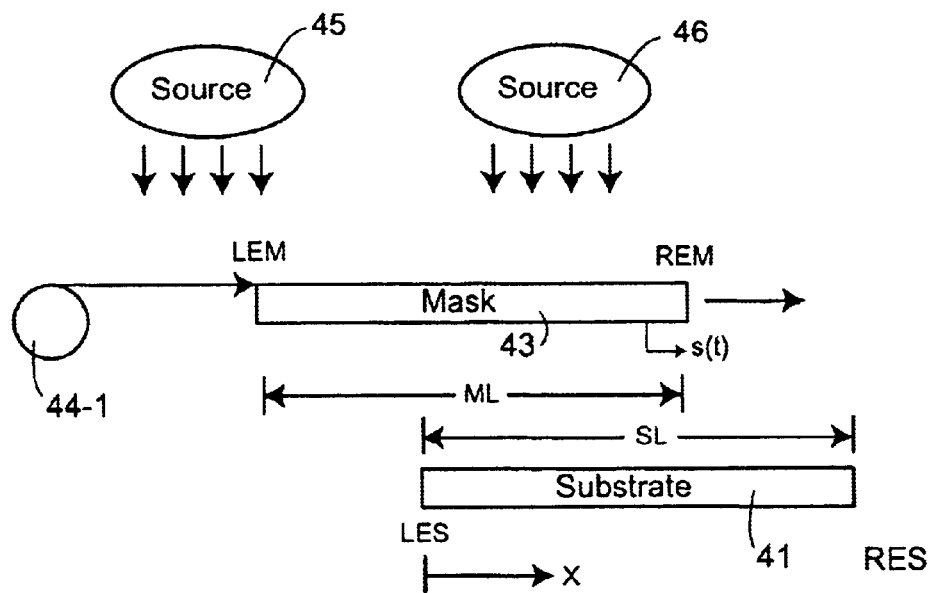
FIG. 2 is a schematic view illustrating use of controlled movement of a mask to generate a linear thickness profile for two chemical components.

FIG. 2 schematically illustrates a deposition procedure for combinatorially synthesizing an alloy, $A_u B_{1-u}$, on a substrate 41 with the index u varying continuously or in small increments between 0 and 1. A mask 43, which is movable from left to right and/or from right to left by a mask stepper motor or other suitable movement device 44, is located between the substrate 41 and one or more chemical component sources 45. The source 45 provides a flux of the chemical constituent A, or a flux of the chemical constituent B. Each source 45 of a chemical constituent, A or B, can be located at the same location, or two or more sources, 45 and 46, may be located at different locations relative to the substrate 41. In a preferred approach, each source 45 is sequentially moved into a beam focus position, and the ion beam or other beam is activated to provide a stream of source particles that preferably move in the general direction of the substrate 41.

In one approach, the mask 43 is moved from left to right and only the first beam-activated source provides a (first) stream of deposition particles in a first time interval. In a second time interval, the second beam-activated source provides a (second) stream of precursor particles. Because the first and second particle streams are provided within different time intervals, this approach produces a multilayer deposition on the substrate.

As the mask 43 moves from the left toward the right, the portion LES of the substrate to the left of the left end LEM of the mask 43 is exposed, for varying amounts of time, with portions of the substrate 41 near the left end LES being exposed for longer times than portions of the substrate near the right end RES of the substrate. This produces a heavier deposit of precursor particles at the left end LES of the substrate 41. The number of precursor particles from the source 45 deposited per unit area decreases monotonically as one moves from the left end LES toward the right end RES of the substrate; and the number of precursor particles deposited per unit area increases monotonically as one moves from the left end LES to the right end RES of the substrate. If, instead, the mask 43 moves from the right toward the left, the number of precursor particles deposited on the substrate 41 decreases monotonically as one moves from the right end RES toward the left end LES.

As a first alternative, the mask 43 can be held fixed and the substrate 41 can be moved from left to right and/or from right to left by a substrate stepper motor or similar movement device 44 to provide a multilayer deposition. As a second alternative, the substrate 41 and the mask 43 can each be moved, independently and at different rates, from left to right and/or from right to left to provide a multilayer deposition.

Preferably, the mask length ML is at least equal to the substrate length SL and the right end REM of the mask 43 begins at a point above the left end LES of the substrate and moves rightward monotonically until the left end LEM of the mask is above the right end RES of the substrate. The amounts of time, Δt(x;A) and Δt(x;B), that a particular location (x) on the substrate is exposed to particle flux from a source 45 must be coordinated in order to deposit appropriate relative amounts of the A and B particles. If the mask length ML and the substrate length SL are equal, the total amount of time $$\Delta t(tot) = \Delta t(x;A) + \Delta t(x;B) \quad (1)$$

any location (x) on the substrate is exposed will be the same, no matter how the mask is moved from left (where REM and LES correspond) to right (where LEM and RES correspond).

The mask may be moved at a linear rate, thus producing a linearly varying alloy composition $A_{u(x)} B_{1-u(x)}$, with $u(x) = a \cdot x + b$ where x is a location coordinate, measured from the left end LES of the substrate 41, and a and b are real numbers related to the speed of movement of the mask from left to right. Alternatively, the mask 43 may be moved at a non-constant rate from left to right, and the chemical composition, u(x) versus 1−u(x), of the alloy $Au(x)B_{1-u}(x)$ will vary nonlinearly as a function of the location coordinate x. The composition u(x) versus 1−u(x) for the relative amounts of and B components is determined by a prescription such as $$w(x) = \int 102 \, [x-s(t)] dt/\Delta t(tot), \quad (2)$$

here s(t) ($0 \leq s(t) \leq SL$; $0 \leq t \leq \Delta t(tot)$) is the x coordinate of the right end REM of the mask 43 at any time t, measured from the left end of the substrate LES, $\chi(u)$ is a characteristic function satisfying $$\chi(u) = 0 \, (u < 0) \quad (3)$$
$$\quad\quad = 1 \, (u > 0),$$

and the integral extends over the time interval $0 \leq t \leq \Delta t(tot)$.

Figures 3A, 3B, 3C:
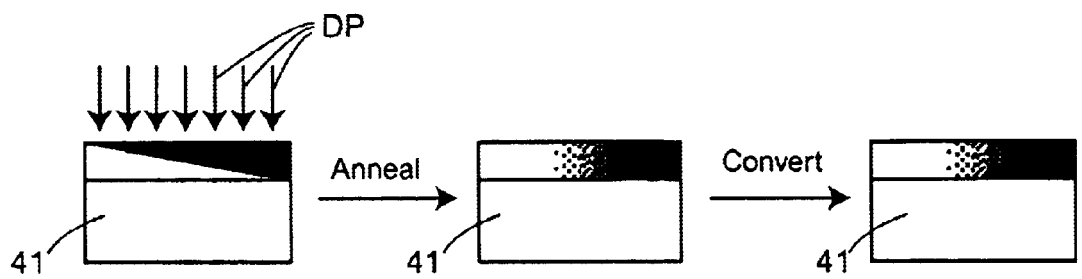
FIGS. 3A, 3B and 3C illustrate use of deposition and interdiffusion to promote formation of metal-inorganic compounds.

FIGS. 3A, 3B and 3C illustrate deposition, interdiffusion and chemical conversion processes. In FIG. 3A, the precursors DP are incident on and received at the substrate 11, forming one or more layers, optionally with a concentration gradient. In FIG. 3B, the substrate 11 is subjected to interdiffusion and/or annealing of the precursors DP deposited in FIG. 3A. This produces a further redistribution of the precursors DP. In FIG. 3C, the interdiffused precursors of FIG. 3B are combined with ion beam sputter-assisted carbon, oxygen, nitrogen, carbon, halogen or other selected compounds to provide carbidized, nitridized, oxidized, halogenated or other desired compounds on the substrate 11, using the reactive chemical source 27 of FIG. 1 or another source.

Figure 4:
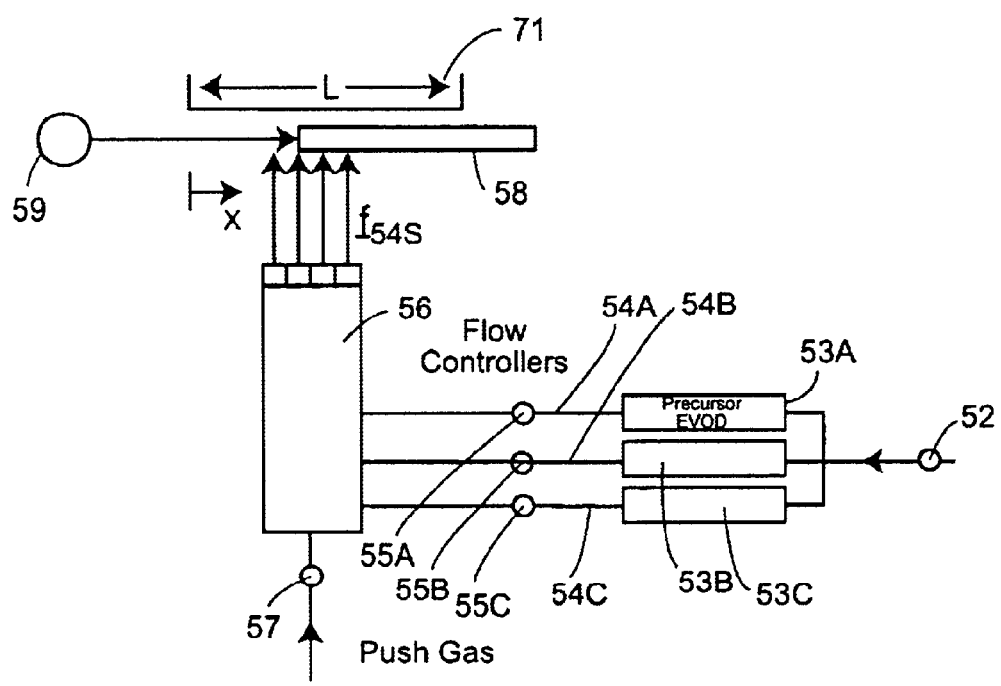
FIG. 4 is a schematic view illustrating use of CVD for combinatorial synthesis of a material.

FIG. 4 schematically illustrates combinatorial synthesis of a compound on a thermally controlled substrate 51 using chemical vapor deposition (CVD) to provide in situ or multilayer deposition for combinatorial synthesis. A carrier gas source 52 provides a carrier gas (preferably inert) that is passed through a selected number of one or more precursor evaporators or "bubblers", 53A, 53B and 53C, that provide the active vapor substance(s), 54A, 54B and 54C, for CVD, either simultaneously or sequentially. Optionally, the active vapors, 54A, 54B and 54C, pass through corresponding flow controllers, 55A, 55B and 55C, that determine the active vapor flow rates of the respective vapors at any given time. The active vapors enter a pre-deposition chamber 56 and are moved axially along the chamber by a push gas provided by a push gas source 57. Flux $f_{54S}$ of the active vapor mix (S=A, B and/or C) is stopped by, or is allowed to pass beyond, a movable mask or shutter or aperture 58 whose transverse location, given by s=s(t), is controlled by a mask stepper motor or other mask movement device 59 that moves the mask transversely (not necessarily perpendicularly), relative to a line of sight extending from the source (predeposition chamber 56) toward the substrate 51, across an exposed surface of the substrate 51. As a first alternative, the mask 58 is fixed in location and a substrate stepper motor or other substrate movement device 59 moves the substrate 51 transversely. As a second alternative, the mask movement device 59 and substrate movement device 60 independently move the substrate 51 and the mask 58 transversely at the same time.

By separately controlling the precursor evaporators, 53A, 53B and 53C, and the corresponding flow controllers, 55A, 55B and 55C, the mix of active vapors 54S that issues from the pre-deposition chamber 56 can be closely controlled as a function of time. By controlling the mask location, x=s(t), the relative amounts of the vapors 54S deposited on different regions of the substrate 51 can be varied independently from point to point. For example, the relative fraction f(x;54S) ($0 \leq x \leq L$) of the active vapor 54S (S=A, B, C) deposited on the substrate 51 can be caused to vary linearly with lateral distance coordinate x from the left end of the substrate as $$f(x; 54A) = a1 + b1 \cdot x, \quad (4A)$$
$$f(x; 54B) = a2 + b2 \cdot x, \quad (4B)$$
$$f(x; 54C) = a3 + b3 \cdot x, \quad (4C)$$

where the magnitudes and signums of the coefficients a1, a2, a3, b1, b2 and b3 are independently chosen, subject to the constraint $$0 \leq f(x;54A) + f(x;54B) + f(x;54C) \leq 1 \, (0 \leq x \leq L). \quad (5)$$

Figure 5A:
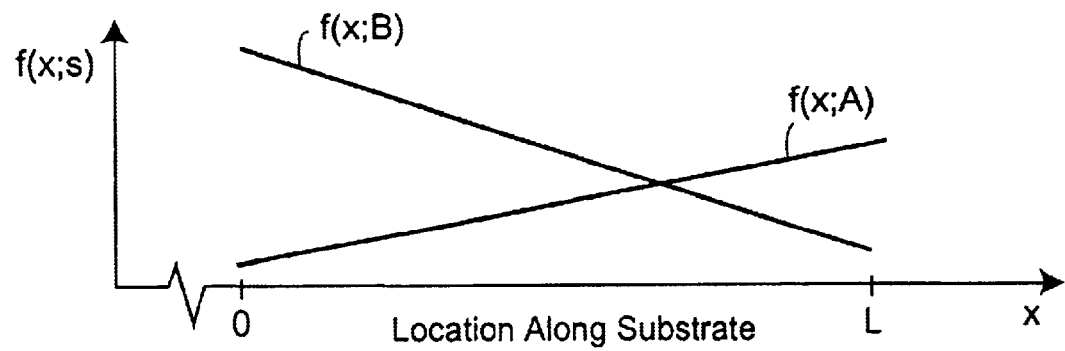
FIGS. 5A and 5B are graphical views of possible deposition patterns generated using the apparatus of FIG. 4 or FIG. 6A.
Figure 5B:
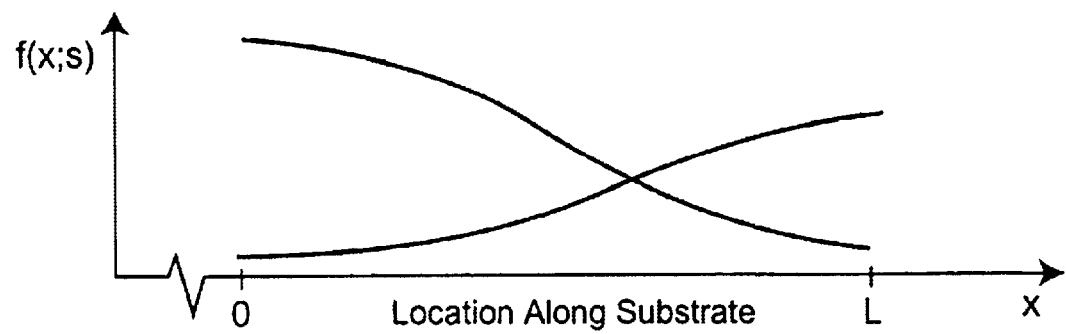

For example, the coefficients b1 and b2 may be positive and negative, respectively, so that the relative or absolute concentrations of the vapors 54A and 54B are increasing and decreasing, respectively, as the coordinate x increases, as illustrated in FIG. 5A. The linear changes in concentration with the coordinate x in Eqs. (4A)–(4C) may be replaced by nonlinear changes in one or more of the quantities f(x;54S) by appropriate control of the flow controllers 55A–55C and of the location of the movable mask 58. One possible result of such nonlinear deposition is shown in FIG. 5B. If a uniform concentration of an active vapor 54S is desired, the substrate 51 can be rotated during the time(s) this vapor is deposited. One or both of the concentrations of the deposited vapors 54A and 54B may be linear or may be nonlinear. Combinatorial deposition of two or more vapors 54S occurs by CVD, either one layer at a time or simultaneously, producing a multilayer or an in situ deposition, in the apparatus shown in FIG. 4.

The source of each active vapor 54S (S=A, B, C) can be (1) a solid or liquid substance packed into the corresponding evaporator 53S, (2) a solid powder or liquid dissolved into an organic solvent or (3) any other source that will provide a vapor substance of the desired precursor when heated to a temperature in a selected temperature range. Where source (1) is present, vaporizer temperature and flow rate of the carrier gas can be used to control the rate of delivery of a precursor. Where source (2) is present, the rate of delivery of a precursor is controlled by vaporizer temperature, carrier gas flow rate and pumping rate of the precursor solution into the corresponding vaporizer unit, such as 53A.

Figure 6A:
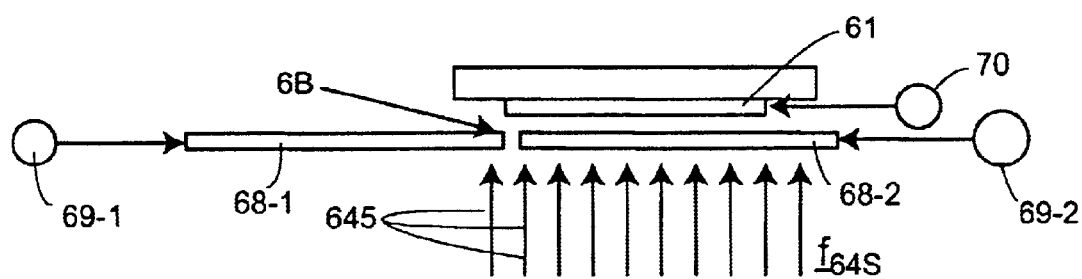
FIGS. 6A and 6B are schematic views illustrating use of a movable slot window or slit to control growth rate in a linear ramp for in situ formation of a compound $A''B_{1-u}$.
Figure 6B:
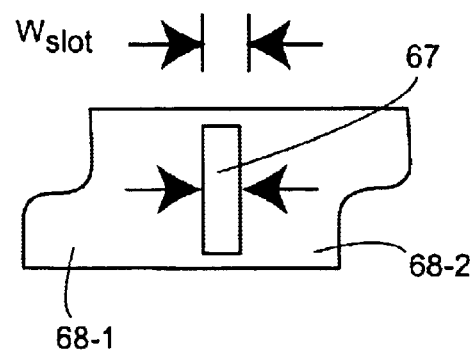

Combinatorial deposition on a substrate 61 can also be performed by in situ co-deposition, using the apparatus shown in FIGS. 6A and 6B. A precursor vapor flux $f_{64S}$ (S=A, B, C), which may include a mixture of vapors at any given time, is incident upon two or more spaced apart movable masks, 68-1 and 68-2, in FIG. 6A that together form one or more movable slots or apertures 67, as shown in FIG. 6B. The relative mix of vapors 64S may vary from one time to another time, and the slot(s) 67 need not move at a uniform rate across the exposed surface of the substrate 61. Further, the width $w_{slot}(t)$ of a slot or aperture may vary according to a selected function with time t so that the slot aperture is wider at some times than at other times and may close altogether at one or more times. If the slot width $w_{slot}(t)$ is fixed and the rate v(t) at which the slot moves across the exposed surface of the substrate 61 is uniform, in situ co-deposition of two vapors with constant concentration gradients can be obtained, as illustrated in FIG. 5A, by varying the relative concentrations of the vapors 64A and 64B with time. This approach will produce a chemical mixture of $(64A)_{u(x)}(64B)_{(1-u(x))}$ as x varies from 0 to L across the exposed surface of the substrate 61, with the index u(x) increasing or decreasing, linearly or nonlinearly, with increasing x. The concentration fractions of the two or more components, 64A and 64B, may also be arranged to vary nonlinearly, as illustrated in FIG. 5B.

As a first alternative, the masks 68-1 and 68-2 are fixed in location and a substrate stepper motor or other substrate movement device 70 moves the substrate 51 transversely. As a second alternative, the mask movement devices 69-1 and 69-2 and the substrate movement device 70 independently move the substrate 51 and the masks, 58-1 and 58-2, transversely relative to the direction of the flux $f_{64S}$.

One advantage of the in situ co-deposition process illustrated in FIGS. 6A and 6B, over the multilayer process, illustrated in FIG. 3, is that the post-anneal procedure may be eliminated or minimized in the co-deposition process. Another advantage is that the temperature at which a post-anneal process, if any, is performed can be reduced. The in situ co-deposition process, illustrated in FIGS. 6A and 6B, can also be applied to co-sputtering, to co-evaporation, to co-ablation (e.g., using a laser ablating source), and to molecular beam epitaxy (MBE). Among these approaches, ion beam sputtering and MBE are especially attractive, because the deposition rates for these approaches can be more closely controlled through monitoring with a negative feedback loop.

Figure 7A:
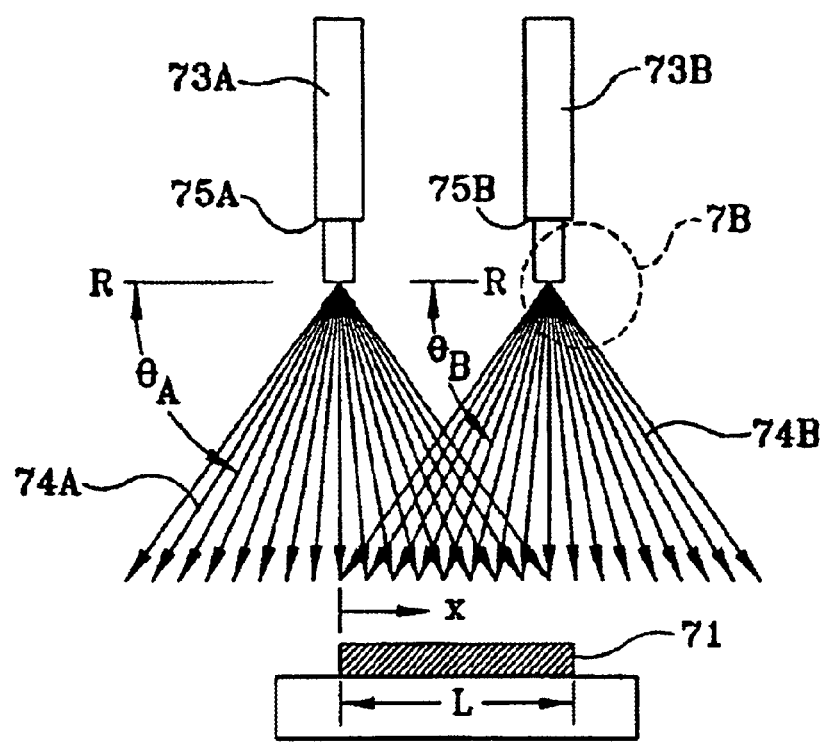
FIGS. 7A, 7B, 8 and 9 are schematic views illustrating use of two or three nuzzles to generate a linear deposition profile for in situ formation of a compound $A_uB_{1-u}$ or $A_uB_vC_{1-u-v}$.
Figure 7B:
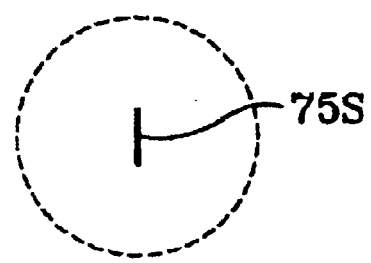

FIG. 7A illustrates another co-deposition approach, using two or more nuzzle slits, 75A and 75B, located at the exits of two vapor source chambers, 73A and 73B, respectively. Vapors, 74A and 74B, that exit through the nuzzle slits, 75A and 75B, may be arranged to vary independently in a linear or nonlinear manner with respective angles, θA and θB, measured relative to a reference line RR such as shown in FIG. 7A. FIG. 7B schematically illustrates a nuzzle slit, in which a throat associated with the slit is shaped to produce a desired relative flow rate ψ(θ) that varies in a controllable manner with an angle θ, measured relative to a reference line. An example of a nuzzle slit is a garden hose nozzle, in which movement of a small flow obstruction changes the spread of water that issues from the hose.

Figure 8:
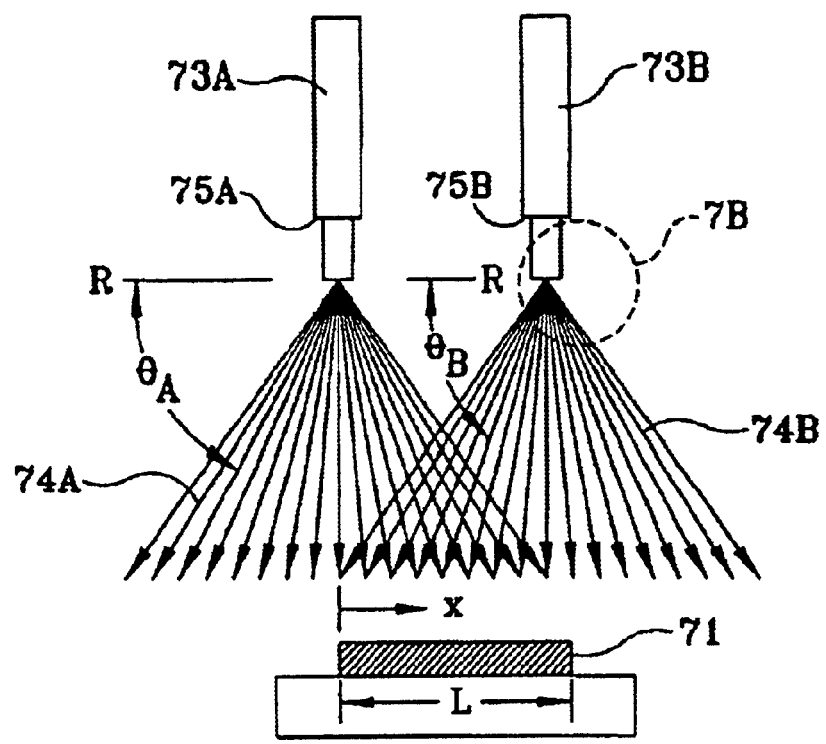

With reference to FIG. 8, assume that the nuzzle slits, 75S (S=A, B), are located at a distance D from the exposed planar surface of the substrate and are designed to provide flow rates, ψ(θA) and ψ(θB), given by $$(d/dx)\psi(\theta A)\cdot\sin(\theta A) = -\{\sin^2\theta A / D\}(d/d\theta A)\psi(\theta A)\cdot\sin(\theta A) \quad (6A)$$
$$= b1 = \text{constant},$$

$$(d/dx)\psi(\theta B)\cdot\sin(\theta B) = -\{\sin^2\theta B / D\}(d/d\theta B)\psi(\theta B)\cdot\sin(\theta B) \quad (6B)$$
$$= b2 = \text{constant},$$

where b1 and b2 are selected constant coefficients. The deposition rates, g(x;74A) and g(x;74B), of the respective vapors, 74A and 74B, on the substrate 71 will then vary linearly according to $$g(x;74A)=a1+b1\cdot x \quad (7A)$$
$$g(x;74B)=a2+b2\cdot x \quad (7B)$$

where a1 and a2 are appropriate constant coefficients. This will provide a linearly varying co-deposition mix on the exposed surface of the substrate 71 of $(74A)_{(x/L)}(74B)_{(1-x/L)}$ as the coordinate x varies from 0 to x/L. An ultrasonic nuzzle can be used for the apparatus shown in FIGS. 7A and 7B.

A CVD approach is suitable where the precursor vapors can be pressurized and deposited according to the linear patterns in Eqs. (7A) and (7B). However, the nuzzle approach may be difficult to apply using ion beam sputtering, co-sputtering, co-evaporation, co-ablation and MBE, because the precursor particles used in these processes are generated by point sources and the normal deposition profile on a substrate is Gaussian, rather than varying linearly with the coordinate x. A magnetron sputtering gun can be constructed to provide a nuzzle configuration. Ion beam deposition, for example, as developed by SKION Corporation in Hoboken, N.J., can also be used with this approach to deposit C, Si, Ni, Cu and other metals and alloys, using an electrical field to control the initial velocity of the ion that issues from the ion beam sputtering source.

Figure 9:
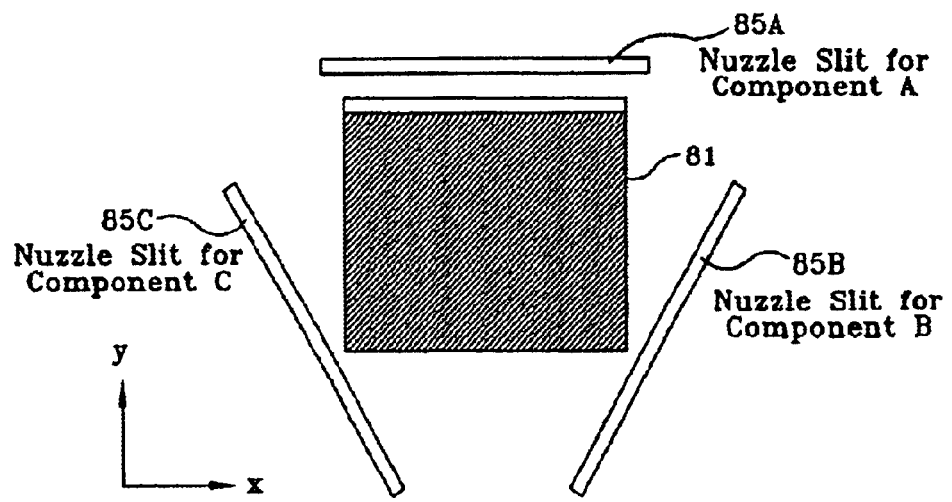

Two or more nuzzle slits and corresponding vapor sources can also be arranged in a non-parallel array, as illustrated in FIG. 9, to provide a two-dimensional relative concentration fraction f(x,y) of the three vapors, 84A, 84B and 84C, given by $$f(x,y;A;B;C)=(84A)_{h(x,y;A)}(84B)_{h(x,y;B)}(84C)_{h(x,y;C)}, \quad (8)$$

where h(x,y;A), h(x,y;B) and h(x,y;C) are two-dimensional distributions that are determined by the designs of the nuzzle slits 85A, 85B and 85C, respectively. Three nuzzle slits may be arranged at the vertices of, or along three sides of, a general triangle, not necessarily isosceles or equilateral.

Figure 10A:
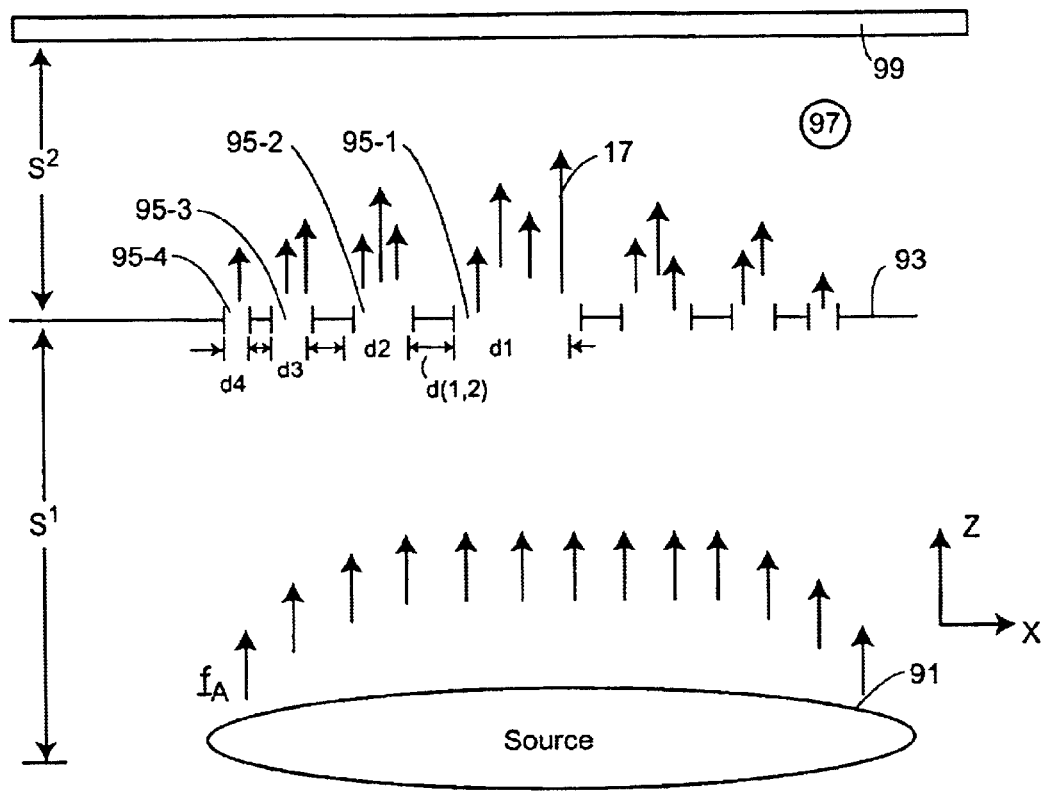
FIGS. 10A/10B and 11A/11B are pairs including a schematic view and a graphical view illustrating two embodiment of the invention, using one and two sources, respectively.
Figure 10B:
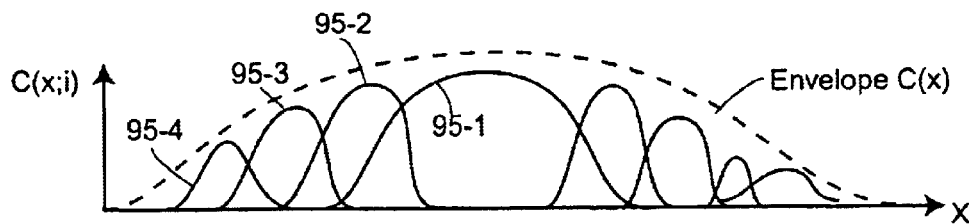

FIGS. 10A and 10B illustrate, schematically and graphically, an embodiment of the invention. A chemical component source 91 provides a chemical component, denoted A, that is to be deposited on a substrate 99. In a preferred embodiment, the source 91 provides a flux $f_A$ of the chemical component A that is approximately uniform in a selected coordinate direction z. If the flux $f_A$ is not approximately uniform in a plane Π perpendicular to the z-direction, but is known as a function of the Cartesian coordinates, x and y, measured in the plane Π, the details of this embodiment can be varied to achieve substantially the same result. Alternatively, a portion of the flux $f_A$ from the source can be masked to provide an approximately uniform flux through the mask aperture(s).

In this embodiment, a mask 93 having a sequence of spaced apart apertures 95-i (i=1, 2, 3, 4, . . . ) with aperture widths di is positioned in an xy-plane, transverse to the z-direction of the flux $f_A$ from the source 91 and spaced apart from the source by a selected distance s1. The mask 93, in turn, is spaced apart from the substrate 99 by a distance s2. The space 97 between the mask 93 and the substrate 99 is either evacuated to a high vacuum or is filled with a selected gas at a selected low density ρ97.

The aperture 95-i has an aperture width di in a selected x-direction, and two adjacent apertures, such as 95-2 and 95-3, have a selected aperture spacing distance D(2,3). In one version of this embodiment, the aperture spacings D(i,i+1) are uniform. In another version of this embodiment, the aperture spacings D(i,i+1) are variable according to the substrate deposition pattern desired. If a single aperture 95-i receives the flux $f_A$ from the source 91, the precursor particles A passed through the mask 93 at the aperture 95-i will arrive at and deposit on the substrate 99 in an approximately Gaussian or normally distributed concentration pattern C(x;i), as a function of the transverse coordinate x, as illustrated in FIG. 10B. However, if a collection of three or more apertures 95-i is provided with suitable aperture widths di and suitably chosen aperture spacings D(i,i+1), the sum of these apertures will produce a concentration envelope C(x) (or C(x,y)) of selected shape at the substrate shown in FIG. 10B. The aperture widths and aperture spacings shown in FIG. 10A are relatively large for display purposes. In practice, these dimensions would be relatively small, probably in the range 0.01–1 mm, or larger or smaller where suitable.

The concentration envelope C(x) may be chosen to be linear, $$C(x) = a + b \cdot x \quad (9A)$$

or to be linear-symmetric, $$C(x) = a + b|x|, \quad (9B)$$

or to obey a more general power law $$C(x) = a' + b' \cdot |x|^q \quad (q \neq 0), \quad (9C)$$

where a, b, a', b' and q are selected real numbers. The particular concentration envelope C(x) (or C(x,y)) produced will depend upon the parameters di (aperture widths), D(i, i+1) (aperture spacings), s1 (source-to-mask spacing), s2 (mask to substrate spacing), the gas, if any, and its density ρ97 in the space 101, the range of flux $f_A$ of the chemical component A produced in the z-direction by the source 91, and other parameters describing the source.

The concentration envelope C(x) may be modeled as a faltung integral that takes into account the aperture widths and aperture spacings chosen for the mask 93, namely $$C(x) = \int F(x') \, Ap(x') \, H(x-x') dx', \quad (10)$$

where F(x') represents the A particle flux $f_A$ and Ap(x') is a mask characteristic function (=1 where a mask aperture is present; =0 where no mask aperture is present). The presence of the faltung function H(x–x') in the integrand in Eq. (10) accounts for the fact that an A component particle that passes through the mask at a transverse location coordinate x' may become deposited on the substrate at another transverse location coordinate x, due to scattering, initial velocity vector of the particle and other interference phenomena. A suitable approximation for a faltung function for a single aperture is $$H(w) = (2\pi\sigma^2)^{-1/2} \exp\{-w^2/2\sigma^2\}, \quad (11)$$

where the parameter σ (having the units of length) characterizes the transverse spread of flux through a single aperture. Invoking the superposition principle, this faltung function, with possibly a different σ parameter, may be used for each aperture in the mask.

The concentration envelope C(x) shown in FIG. 10B may be reproduced in one direction only, if each aperture 95-i in the mask is uniform in a second transverse coordinate direction y to produce a concentration envelope C(x,y) that depends non-trivially on each of the coordinates x and y.

Figure 11A:
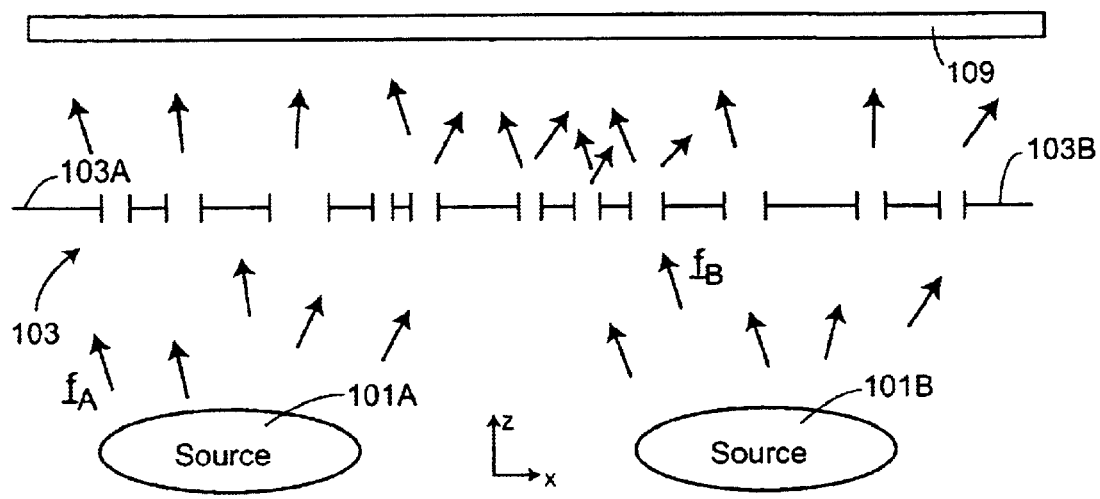
Figure 11B:
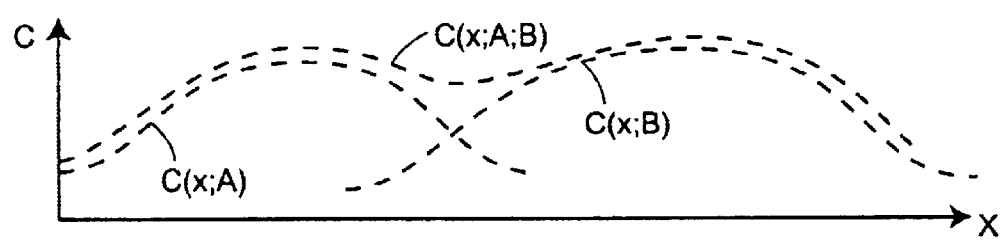

Each chemical component A, B, . . . to be deposited on the substrate may have a different mask with a different aperture pattern and may have different separation distances, s1 and s2. For example, two chemical components, A and B, may (but need not) use the same mask and/or the same separation distances, s1 and s2. FIG. 11A illustrates use of two sources, 101A and 101B, each with its own component mask, 103A and 103B, which are optionally part of an overall mask 103, positioned between the two sources and a substrate 109. The net effect of deposit of components A and B on the substrate 109, either simultaneously or sequentially, is the concentration envelope C(x;A;B), which is a sum of the concentration envelopes C(x;A) and C(x;B) shown in FIG. 11B.

Figure 12:
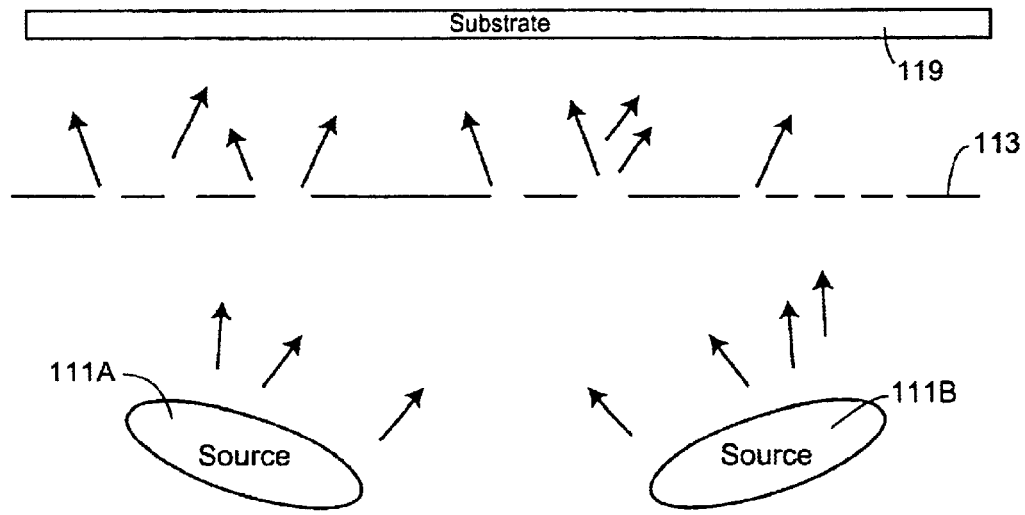
FIGS. 12, 13 and 14 are schematic views of other embodiments.

As a first alternative for multi-component deposition, two or more chemical components, A, B, . . . , each with its own source 111A, 111B, etc. can be simultaneously deposited on a single substrate 119, as illustrated in FIG. 12. A single mask 113, having suitable aperture widths and aperture spacings (not shown explicitly in FIG. 12), is positioned transverse to a direct path or line of sight from at least one source 111A, 111B, etc. to the common substrate 119. The first source 111A and mask 113 produce a first concentration envelope C(x;A) on the substrate 119; and the second source 111B and mask 113 produce a second concentration envelope C(x;B) on the substrate 119. The sum of these concentration envelopes, $$f(x;A;B) = [A] \cdot C(x;A) + [B] \cdot C(x;B), \quad (12)$$

defines the total concentration of the chemical components, A and B, deposited on the substrate. Subsequent processing of the coated substrate, for example, by thermally driven diffusion, may produce a concentration pattern that differs from the initial total concentration envelope f(x;A;B).

Figure 13:
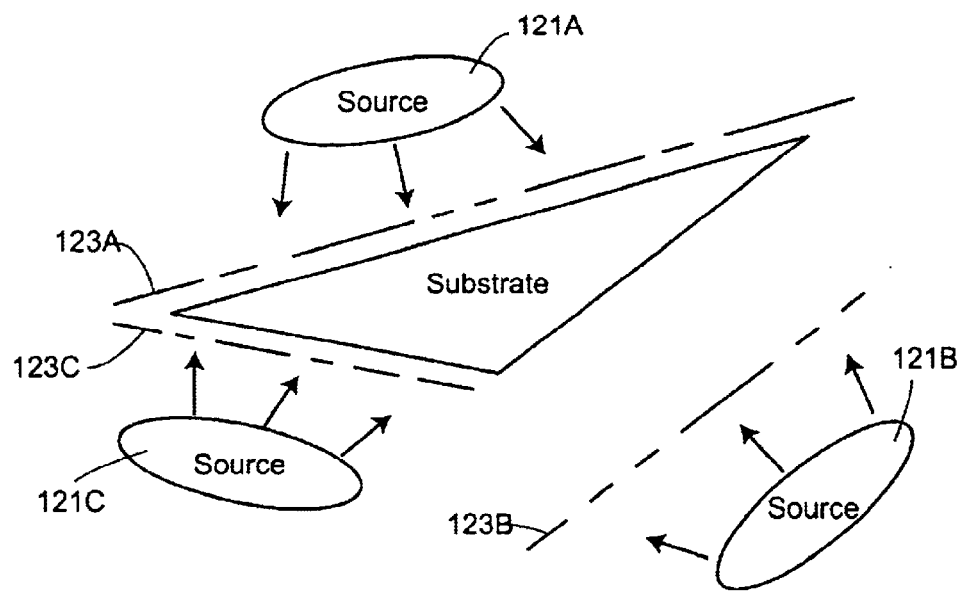

As a second alternative, illustrated in FIG. 13, each of two or more sources, 121A, 121B and 121C, arranged adjacent to and above two or more sides of a polygon (a triangle in FIG. 13) may have its own mask, 123A, 123B and 123C, respectively, and each source mask combination will produce a different two-dimensional concentration envelope, C1(x,y;A) and C(x,y;B) and C(x,y;C), on a common substrate 129 that is positioned adjacent to the sources, with the masks being located between the sources and the substrate. In this embodiment, each of the masks can be separately designed, and thus optimized, for the particular concentration envelope desired for that chemical component.

Figure 14:
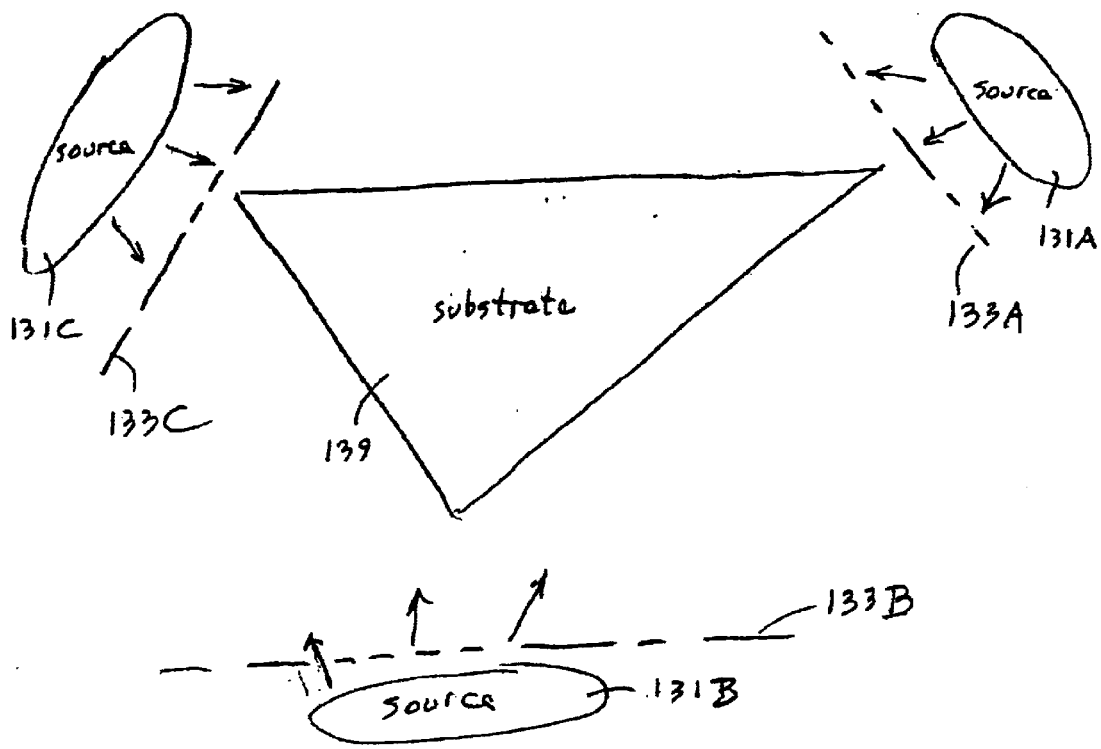

FIG. 14 illustrates an alternative arrangement of the system in FIG. 13, in which sources, 131A, 131B and 131C, are located adjacent to and above two or more vertices of a polygon, and masks, 133A, 133B and 133C, are located between a common substrate 139 and the respective sources.

Figure 15:
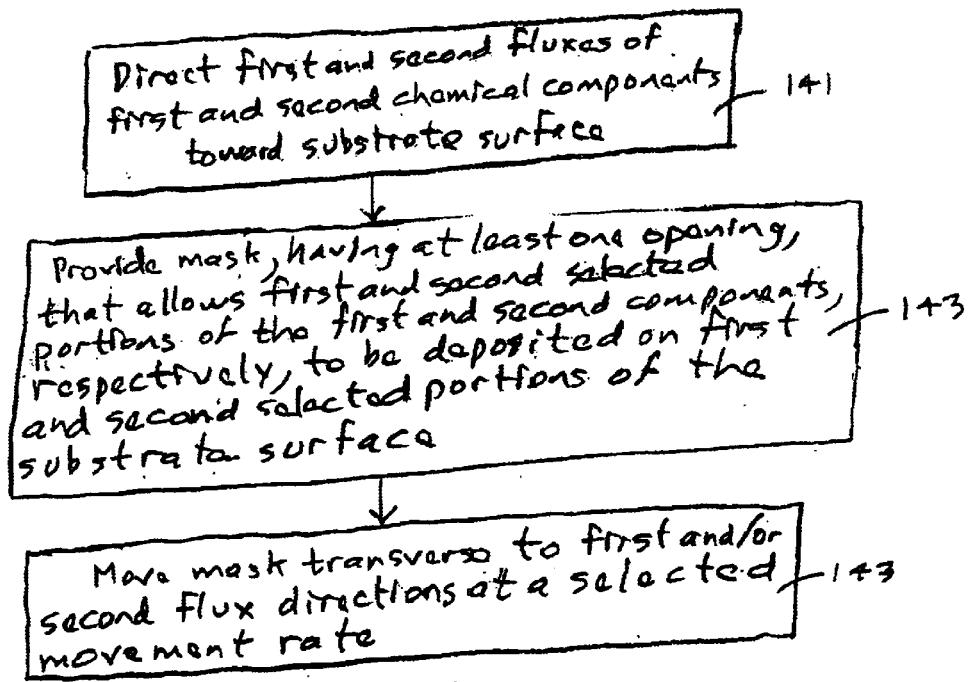
FIG. 15 is a flow chart illustrating practice of the invention.

FIG. 15 is a flow chart generally illustrating the processes used to practice the invention. In a process 141, first and second fluxes of respective first and second chemical components are directed toward a substrate. In a process 143, a mask, having at least one opening (e.g., an aperture or an edge) is provided across the flux field that allows first and second selected portions of the respective first and second chemical components to be deposited on selected first and second portions of the substrate surface. In a process 145 (optional), the mask is moved transversely to at least one of the first and second flux directions at a selected movement rate, to provide a desired concentration of the first and second components on the substrate surface.

What is claimed is:

1. A system for in situ depositing on a substrate a mixture of selected first and second chemical components having concentrations of the first and second component that vary linearly with a location coordinate measured along a surface of the substrate, the system comprising:

first and second sources of respective first and second chemical components, spaced apart from a non-moving substrate; and first and second non-moving adjacent nuzzle slits associated with the first and second sources, respectively, that direct the first and second components toward the substrate with selected first and second flux patterns that vary linearly with a location coordinate x, measured in a selected location coordinate direction that is oriented transverse to a line extending from at least one of the first nuzzle slit and the second nuzzle slit to the substrate to deposit a single layer, in situ combination on a selected portion of the substrate.

2. The system of claim 1, wherein said first and second slits direct said first flux and said second flux in first and second flux patterns, respectively and direct said first flux and said second flux in selected third and fourth nonuniform flux patterns, respectively, in a selected second coordinate direction that is transverse to a first coordinate direction and is transverse to said line extending from at least one of said first nuzzle slit and said second nuzzle slit to said substrate.

3. The system of claim 1, wherein at least one of said first source and said second source is drawn from a group of sources consisting of an ion beam source, and a chemical vapor deposition source.

4. The system of claim 1, wherein at least one of said first and second chemical components includes at least one chemical element drawn from a group of chemical elements consisting of lithium, sodium, potassium, rubidium, cesium, berkelium, magnesium, calcium, strontium, barium, boron, aluminum, gallium, carbon, silicon, germanium, nitrogen, phosphorous, arsenic, oxygen, sulfur, selenium, tellurium, fluorine, chlorine, bromine, and iodine.

5. A system for in situ depositing on a substrate a selected chemical component having a concentration that varies linearly with a location coordinate measured along a surface of the substrate, the system comprising:

a vapor source of a selected first chemical component, spaced apart from a non-moving substrate by a first selected distance, where the source provides a chemical component flux in a flux direction extending from the source toward the substrate; and a non-moving mask, positioned between the source and the substrate at a second selected distance from the source the mask having at least first and second spaced apart apertures with selected corresponding first and second aperture widths and a selected aperture spacing between the first and second apertures;

where the aperture widths and the aperture spacings are selected so that a flux of the first chemical component varies linearly with a location coordinate x, measured in a selected coordinate direction that is transverse to a line extending from the source to the substrate to deposit a layer of the first chemical component on a selected portion of the substrate.

6. The system of claim 5, wherein said source is drawn from a group of chemical component sources consisting of an ion beam source, a sputtering source, a laser ablation source, a molecular beam source, a chemical vapor deposition source, and an evaporative source.

7. The system of claim 5, wherein said first chemical component includes at least one chemical element drawn from a group of chemical elements consisting of lithium, sodium, potassium, rubidium, cesium, berkelium, magnesium, calcium, strontium, barium, boron, aluminum, gallium, carbon, silicon, germanium, nitrogen, phosphorous, arsenic, oxygen, sulfur, selenium, tellurium, fluorine, chlorine, bromine and iodine.

8. The system of claim 2, wherein said first and second coordinate directions are independent of each other.

9. The system of claim 5, further comprising:

a second source of a selected second chemical component, spaced apart from said substrate by a third selected distance and positioned adjacent to said first source so that a flux of the second chemical component varies linearly with said location coordinate, to deposit a combined layer of said first chemical component and the second chemical component on a second selected portion of said substrate.

* * * * *